United States Patent
Asaka

(10) Patent No.: US 6,189,128 B1
(45) Date of Patent: Feb. 13, 2001

(54) DESIGN FOR TESTABILITY METHOD SELECTIVELY EMPLOYING TWO METHODS FOR FORMING SCAN PATHS IN A CIRCUIT

(75) Inventor: Toshiharu Asaka, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/141,329

(22) Filed: Aug. 27, 1998

(30) Foreign Application Priority Data

Aug. 28, 1997 (JP) .................................................... 9-232578

(51) Int. Cl.[7] .............................. G06F 17/50; G01R 31/28

(52) U.S. Cl. ................................................ 716/4; 714/726

(58) Field of Search ..................... 716/4, 6, 18; 714/724, 714/726, 729

(56) References Cited

U.S. PATENT DOCUMENTS

| 5,331,570 | * | 7/1994 | Bershteyn ................................. 716/4 |
| 5,696,771 | * | 12/1997 | Beausang et al. ................... 371/22.3 |
| 5,703,789 | * | 12/1997 | Beausang et al. ......................... 716/4 |
| 5,748,647 | * | 5/1998 | Bhattacharya et al. ............ 371/22.31 |
| 5,831,868 | * | 11/1998 | Beausang et al. ...................... 716/18 |
| 5,903,466 | * | 5/1999 | Beausang et al. ...................... 716/18 |
| 6,028,988 | * | 2/2000 | Asaka ....................................... 716/4 |
| 6,067,650 | * | 5/2000 | Beausang et al. ................... 714/726 |
| 6,070,258 | * | 5/2000 | Asaka ................................... 714/724 |

FOREIGN PATENT DOCUMENTS

| 1-302850 | 12/1989 | (JP) . |
| 7-271845 | 10/1995 | (JP) . |
| 8-184647 | 7/1996 | (JP) . |
| 11-25138 | 1/1999 | (JP) . |

OTHER PUBLICATIONS

Bhattacharya et al., "H–SCAN: A High Level Alternative to Full–Scan Testing With Reduced Area & Test Application Overheads," 14th VLSI Test Symposium, pp. 74–80, 1996.*

Cox, "On Synthesizing Circuits w/ Implicit Testability Constraints," Int'l Test Conference, Paper 40.1, pp. 989–998, 1994.*

Miles et al., "Estimation of Area Overheads of Testable VLSI Circuits," IEE Colloquium on DFT, pp. 411–417, 1988.*

Narayanan et al., "SIESTA: A Multi–Facet Scan Design System," IEEE, pp. 246–251, 1992.*

Russell, "Knowledge Based Systems Used in Design for Testability—An Overview," IEE Colloquium on Algorithmic & Knowledge Based CAD for VLSI, pp. 1/1–1/4, 1989.*

T. Asaka et al., "H–SCAN: A Practical Low–Overhead RTL Design–for–Testability Technique for Industrial Designs", IEEE International Test Conference Proceedings, 1997, pp. 265–274.

* cited by examiner

Primary Examiner—Paul R. Lintz
Assistant Examiner—Leigh Marie Garbowski
(74) Attorney, Agent, or Firm—Sughrue, Mion, Zinn, Macpeak & Seas, PLLC

(57) ABSTRACT

The design for testability method of this invention forms scan paths in a circuit preliminarily-designed with required elements. According to this design method, a plurality of appropriated paths that can be appropriated as scan paths are extracted from the multiplicity of path of the circuit, occupied areas are individually calculated for each of the plurality of appropriated paths both for cases in which scan paths are formed using multiplexers and for cases in which registers are replaced by scan elements, and in each case the scan path having the smaller occupied area is selected and formed. The two types of methods for forming scan paths are selected for each portion of the circuit, thereby allowing scan paths to be formed with the smallest occupied area in the circuit.

11 Claims, 11 Drawing Sheets

| OPERATING MODE | PATH OF 0 | PATH OF 1 |
|---|---|---|
| NORMAL MODE : 0<br>TEST MODE : 1 | 22, 21, 23 (AND gate with C and TEST) | 22, 21, 25 (OR gate with C and TEST) |
| NORMAL MODE : 1<br>TEST MODE : 0 | 22, 21, 24 (AND gate with C and TEST) | 22, 21, 26 (OR gate with C and TEST) |

NOMAL MODE : 1
TEST MODE : 0

NOMAL MODE : 0
TEST MODE : 1

DESIGN FOR TESTABILITY METHOD SELECTIVELY EMPLOYING TWO METHODS FOR FORMING SCAN PATHS IN A CIRCUIT

BACKGROUND OF THE INVENTION

1. Field of the Invention

The present invention relates to a design for testability method for designing circuits, and more particularly to a design for testability method that forms scan paths in a circuit.

2. Description of the Related Art

Recent years have seen the development of technology for micro-integrating various types of circuit elements such as registers and multiplexers, and LSI (Large Scale Integrated Circuits) and MMIC (Micro Monolithic Integrated Circuits) have been put into practical use as integrated circuit devices.

Such integrated circuit devices comprise a large number of interwired circuit elements such as registers and multiplexers. Scan test is one method of testing such large numbers of circuit elements.

Scan paths, which are signal paths for scan test, are formed in advance in integrated circuit devices in which scan test is carried out. These scan paths enable both input of test signals to the large number of circuit elements and the extraction of output signals from large number of circuit elements.

In designing, register transfer level sequential integrated circuit devices, are converted to gate level sequential integrated circuit devices. At the gate level, FF (flip-flops), which are required elements in an integrated circuit device, are replaced by scan flip-flops for forming scan paths. A large number of scan flip-flops located in an integrated circuit device are connected so as to function as shift registers during execution of a scan test. Scan test signal paths connected in this way are referred to as scan paths. Of these scan paths, the data input terminal of the flip-flop located closest to the fan-in side is connected to the external input terminal, referred to as scan-in, for scan tests. The data output terminal of the flip-flop located closest to the fan-out side is connected to the external output terminal for scan test referred to as fan-out.

All of the flip-flops function as shift registers under the test mode, which is the operation mode of the integrated circuit device during execution of a scan test. Data for testing can therefore be inputted from scan-in and set at flip-flops, and test results held at flip-flops can be outputted from scan-out and observed. The testing problems of sequential circuits can therefore be simplified to the testing problems of combinational circuits.

Design for testability methods of the prior art will next be described with reference to FIGS. 1 to 3.

First, preliminary design is carried out for a register transfer level circuit 1. As shown in FIG. 1, circuit 1 has three 2-bit registers 2–4 and three multiplexers 5–7 as its required circuit elements.

Register 2 is connected to register 3 by way of first multiplexer 5 and second multiplexer 6 in that order. Register 3 is connected to register 4 by way of third multiplexer 7.

In FIG. 1, "R1–R3" indicates that blocks 2–4 are registers, and "M1–M3" indicates that blocks 5–7 are multiplexers. "C1–C5" are processing data, and "Cm1–Cm3" are control signals.

In the first design for testability method of the prior art, in a case in which a preliminary design of circuit 1 has been produced using the required elements as described hereinabove, scan paths are formed by replacing registers 2–4 of circuit 1 by scan flip-flops, as shown in FIGS. 2a and 2b. In FIGS. 2a and 2b as well, "R(1), R(0)" indicates that blocks 2–4 are registers, and "TEST" is a control signal for scan testing.

To describe in greater detail, in a case in which circuit 11 is completed by forming scan paths in preliminarily-designed circuit 1 as shown in FIG. 3, registers 2–4 are replaced by scan flip-flops 12–14, and multiplexer 15 for scan-out is connected to final scan flip-flop 14 as an additional element.

Multiplexer 15 is needed only when existing external output terminals are appropriated as scanout terminals. Therefore, when newly providing scanout terminals, multiplexer 15 can be eliminated.

Scan flip-flops 12–14, are equivalent to a construction in which a multiplexer is inserted as an additional element immediately before the register, which is a required element.

However, the element interiors of scan flip-flops 12–14 are optimized as circuit elements and therefore occupy less area than a case in which multiplexers are simply added immediately before registers 2–4.

"R1, 2, . . . " in FIG. 3 also indicates registers, and "M1, 2, . . . " also indicates multiplexers. "C1, 2, . . . " are processing data and "Cm1, 2, . . . " are control signals. "TEST" is a control signal for scan testing, "SCAN-IN (0), (1)" are test signals to be supplied to circuit 1 in a scan test, and "SCAN-OUT (0), (1)" are test signals to be outputted.

In circuit 11 formed according to the foregoing description, the operating mode of scan flip-flops 12–14 can be switched between normal mode and test mode. Under the test mode, a scan test can be executed by transmitting test signals to scan paths.

In the above-described design for testability method, all registers 2–4 of circuit 1 are simply replaced by scan flip-flops 12–14.

However, "H-SCAN: A High-Level Alternative to Full Scan Testing with Reduced Area and Test Application Overheads" (14$^{th}$ VLSI Test Symposium 1996, IEEE, pp. 74–80) discloses the appropriation of existing paths inherently in the original design to reduce area overhead associated with forming scan paths.

This design for testability method will be described hereinbelow as the second example of the prior art. Portions equivalent to those of the above-described first example of the prior art are identified using the same reference numerals and redundant explanation is omitted.

Scan paths can be formed by replacing registers 2–4 of circuit 1 by scan flip-flops 12–14 as described hereinabove, but scan flip-flops 12–14 are equivalent to a construction in which multiplexers are inserted immediately before registers 2–4.

In other words, the portions of registers 3 and 4 having multiplexers 5–7 inserted in the preceding sections can form scan paths under the control of multiplexers 5–7.

In the design for testability method of the second example of the prior art, in a case in which multiplexer 22 exists as shown in FIG. 4 as a required element in the section preceding register 21, which is a required element in the preliminary design of a circuit, the path of this portion is extracted as an appropriated path that serves as a scan path, and in accordance with input conditions, a variety of logic gates 23–26 as shown in FIG. 5 are connected as control elements, which are additional elements, to the control terminal of multiplexer 22.

When the path of the preliminary design of circuit 1 is appropriated to form scan paths as described hereinabove, isolated registers not connected to these scan paths may occur.

In a case in which one of registers 27 and 28, which are required elements, is for this reason not connected to the scan paths in the design for testability method according to the second example of the prior art, as shown in FIGS. 6a and 6b, multiplexer 29 is inserted as an additional element between registers 27 and 28 to form a scan path as shown in FIGS. 7a and 7b. The element "C1" shown in the figure is arbitrary circuit element.

If circuit 31 is formed by applying the above-described design for testability method to previously described circuit 1, scan paths can be formed as shown in FIG. 8 by appropriating the path of registers 2–4 or the path of multiplexers 5–7, which are required elements.

In circuit 31 in which scan paths are formed as described hereinabove, multiplexer 32 is inserted as an additional element in the section preceding first register 2, for which a multiplexer does not exist in a preceding section. Control elements composed of inverter 33 and logic gates 34 and 35 are connected as an additional elements to the control terminals of multiplexers 5 and 6, which are required elements located in the section preceding second register 3.

Similarly, a control element made up of inverter 36 and logic gate 37 is connected as an additional element to the control terminal of multiplexer 7, a required element located in the section preceding third register 4. Multiplexer 15 for scan-out is connected as an additional element in the section following third register 4.

In the design for testability method according to the above-described second example of the prior art, the path of required elements 2–7 of the preliminarily-designed circuit 1 is appropriated to form scan paths in order to reduce the area occupied by circuit 31 in which scan paths have been formed.

However, the occupied area of circuit 31 is designed using this design for testability method of the second example of the prior art may be greater than that of circuit 21 designed by the design for testability method of the first example of the prior art.

For example, if the amount of increase in circuit area, i.e., area overhead, for a case in which a register is replaced by scan flip-flop is "2" and the circuit area resulting from the addition of multiplexer 15, which is used as scan-out, is "4," the area overhead for a case in which circuit 11 is designed from circuit 1 based on the design for testability method according to the first example of the prior art for a case in which registers 2–4 of circuit 1 are of 2-bit structure is:

$(2\times3)\times2+(4\times2)=20.$

In contrast, if the circuit area of the control elements, which are additional elements, is "1" for each of inverters 33 and 36, "2" for each of AND gates 34 and 37, and "2" for OR gate 35, the area overhead for a case in which circuit 31 is designed from circuit 1 based on the design for testability method according to the second example of the prior art is:

$(4\times4)+(2\times1)+(2\times2)+(1\times2)=24.$

Although the design for testability method according to the first example of the prior art has smaller area overhead than the second example of the prior art in the above-described examples, the area overhead of the design for testability method according to the second example of the prior art is smaller than the first prior-art example if, for example, the portions of 2-bit structure of the above-described circuit 1 are made 1-bit structure.

Essentially, the design for testability method that realizes the smallest amount of area overhead in circuit area varies according to the configuration of the preliminary-designed circuit, and it is therefore difficult to consistently design a circuit using the optimum design for testability method.

While it is possible to employ such options as designing circuits 11 and 31 using both of the prior-art design for testability methods described hereinabove, comparing the area overhead, and then selecting the optimum method, designing a circuit in this way still does not guarantee that the circuit area overhead will be minimized.

SUMMARY OF THE INVENTION

It is a first object of the present invention to provide a design for testability method and device that can minimize area overhead in the occupied area of a circuit. It is another object of the present invention is to provide an information storage medium in which a program is stored that causes a computer to function as the circuit design device of the present invention. It is still another object of the present invention is to provide a circuit that is designed based on the design for testability method of the present invention.

In a design for testability method of the prior art to which the present invention is applied, circuits are designed in which scan paths, which are signal paths for scan tests, are formed.

In the first embodiment of the invention applied to the above-described design for testability method, paths that can be appropriated as scan paths are extracted as appropriated paths from a multiplicity of paths that connect specific circuit elements in the preliminarily-designed register transfer level circuit.

Next, occupied areas are individually calculated for cases in which a first candidate for a scan path is formed by connecting control elements to the control terminals of multiplexers for each of appropriated paths that include multiplexers, and occupied areas are individually calculated for cases in which a second candidate for the scan path is formed by replacing each of the registers of a plurality of appropriated paths with scan elements.

Finally, for each of the plurality of appropriated paths, the paths having the smaller occupied area are individually selected from among the first candidate and second candidate, and the scan paths corresponding to these selection results are formed.

Accordingly, in a circuit designed based on the design for testability method of this invention, the various types of circuit elements include required elements necessary for normal operation and additional elements added for the purpose of scan tests.

For example, appropriated paths in which control elements that are additional elements are connected to the control terminals of multiplexers that are required elements that are in turn connected to registers that are also required elements may exist as scan paths together with normal paths in which registers that are required elements are replaced by scan elements that have additional elements.

In such cases, each portion of a scan path is formed by the path selected from the appropriated path and normal path that has the smaller occupied area. As for the formation of scan paths, consequently, a circuit is designed with a minimum circuit area. In other words, a circuit can be designed that has the smallest possible area, thereby allowing a contribution toward both miniaturizing and lightening circuits as well as improving productivity.

The circuit referred to in this invention is a device in which various circuit elements are integrated and may take the form of LSI or MMIC.

The circuit elements are elements integrated in a circuit and may be transistors formed by thin-film technology within a LSI.

In addition, the path that serves as the appropriated path connecting specific circuit elements of a circuit may be a path that directly connects a register to another register, a path that directly connects a register to an external terminal, a path that connects a register to another register only by way of multiplexers, and a path that connects an external terminal to a register only by way of multiplexers.

In the above-described design for testability method of the present invention, the order of the steps for calculating the areas of the first-candidate and second-candidate scan paths may be reversed.

In the above-described design for testability method of the present embodiment of the invention, a scan element is constituted by a construction that is optimized overall by inserting multiplexers into sections preceding registers, and a register not connected to a formed scan path can be connected to a scan path by replacement with a scan element.

In such a case, when connecting an isolated register to a scan path, the register is not connected to a scan path by inserting a multiplexer in the section preceding this register, but by replacing the register by a scan element and then connecting to a scan path. This scan element is constituted by a structure in which a multiplexer is inserted in a section preceding the register and is therefore equivalent in construction and function to a case in which a multiplexer is inserted in the preceding section without replacing the register by a scan element.

Because the construction is optimized as one element, however, the occupied area is smaller than for a case in which a multiplexer is inserted in the section preceding the register, and the area of the circuit can therefore be reduced.

In a design for testability method of the prior art in which the second embodiment of the invention is applied, moreover, paths that can be appropriated as scan paths are extracted in order as appropriated paths from the multiplicity of paths that connect specific circuit elements of the preliminarily-designed register transfer level circuit, these appropriated paths are stored, and the stored multiplicity of appropriated paths are then appropriately selected to sequentially form scan paths.

In the second embodiment of the invention applied to this type of design for testability method, when appropriately selecting appropriated paths and sequentially forming scan paths, a path that is connected to the circuit elements of appropriated paths selected as scan paths is excluded from candidates of subsequent selection of appropriated paths.

The design for testability method of this embodiment of the invention thus eliminates superfluous processing in which appropriated paths that cannot be employed as scan paths are taken as candidates for selection, and therefore allows an improvement in the design efficiency for forming scan paths in a circuit.

The first circuit design device of the present embodiment of the invention is provided with at least data input means, path extraction means, data storage means, first calculation means, second calculation means, and path formation means.

In the first circuit design device of the present embodiment of the invention, upon input to the data input means of design data of a preliminarily-designed register transfer level circuit, paths that can be appropriated as scan paths are each extracted by the path extraction means as appropriated paths from the multiplicity of paths that connects specific circuit elements of the circuit whose design data has been inputted.

The occupied areas of each of various circuit elements such as registers and multiplexers are registered beforehand in the data storage means, whereby the first calculation means calculates each of the occupied area for a case in which the first-candidate scan paths are formed by connecting control elements to the control terminals of the multiplexers of each of appropriated paths that include multiplexers, and the second calculation means calculates each of the occupied areas for cases in which the second-candidate scan paths are formed by replacing the registers of each of a plurality of appropriated paths with scan elements.

For example, in a case in which the occupied areas of both a first candidate and second candidate are calculated on a particular appropriated path, the path formation means individually selects from the first candidate and second candidate the candidate having the smaller occupied area based on these calculation results, and a scan path corresponding to these selection results is formed by the path formation means.

Each of the means referred to in this invention may be any device formed to realize the relevant functions. These means may be constituted by, for example, dedicated hardware, a computer empowered with particular functions by a program, functions realized within a computer by means of a particular program, or a combination of these means.

For example, the data storage means may be any element in which various types of information have been recorded beforehand, and may be the storage area of an information storage medium such as ROM (Read Only Memory).

The second circuit design device of this embodiment of the invention is provided with at least data input means, path extraction means, path storage means, path formation means, and candidate selection means.

In the second circuit design device of the present embodiment of the invention, upon input of design data of a preliminarily-designed register transfer level circuit to the data input means, paths that can be appropriated as scan paths are extracted in order as appropriated paths by the path extraction means from among the multiplicity of paths that connect specific circuit elements of the circuit whose design data have been inputted.

The multiplicity of appropriated paths thus extracted in order are stored by the path storage means, whereby this stored multiplicity of appropriated paths are appropriately selected and scan paths are formed sequentially by the path forming means.

When appropriately selecting appropriated paths to sequentially form scan paths in this way, paths connected to circuit elements of appropriated paths that have been selected as scan paths the excluded by the candidate selection means from the candidates for subsequent selection of appropriated paths, thereby eliminating superfluous processing in which appropriated paths that cannot be employed as scan paths are taken as candidates for selection.

Software is stored in the first and second information storage mediums of this invention, and this software is a program that causes a computer to operate as a circuit design device.

Accordingly, when a computer reads the program stored on the first information storage medium of this invention and executes the corresponding processes, the input of the design data of a preliminarily-designed register transfer level circuit is accepted. Paths that can be appropriated as scan paths are each extracted as appropriated paths from the multiplicity of path that connect specific circuit elements of the circuit whose design data have been inputted in this way.

The occupied areas are each calculated for cases in which first-candidate scan paths are formed by connecting control elements to the control terminals of multiplexers of each of the appropriated paths that include multiplexers, and the occupied areas are each calculated for cases in which second-candidate scan paths are formed by replacing the registers of each of a plurality of appropriated paths with scan elements.

For example, in a case in which the occupied areas of both a first candidate and second candidate are calculated on a particular appropriated path, the candidate having the smaller occupied area is individually selected from the first candidate and second candidate based on these calculation results. Scan paths are formed corresponding to these selection results.

The information storage medium referred to in this invention may be any medium in which a program is stored beforehand for causing a computer to execute various processes, and may include, for example, a ROM or a HDD (Hard Disc Drive) that is fixed in a system that is a part of the computer, or a CD-ROM (Compact Disk ROM) or FD (Floppy Disk) that is removably installed in a system which is a part of the computer.

A computer referred to in this invention can be any device that can read a program and execute corresponding processing operations, and may include, for example, a device based on a CPU (central processing unit) with various devices such as ROM, RAM, and I/F (interface) connected as necessary.

When a computer reads the program stored in the second information storage medium of the present invention and executes the corresponding processing operations, input of the design data of a preliminarily-designed register transfer level circuit is accepted. Paths that can be appropriated as scan paths are each extracted as appropriated paths from the multiplicity of paths that connect specific circuit elements of the circuit whose design data have been inputted.

The multiplicity of appropriated paths that are thus sequentially extracted are stored, whereby the stored multiplicity of appropriated paths are appropriately selected and scan paths are sequentially formed.

When appropriately selecting appropriated paths to sequentially form scan paths in this way, paths connected to circuit elements of appropriated paths that have been selected as scan paths are excluded from the candidates for subsequent selection of appropriated paths, thereby preventing superfluous processing in which appropriated paths that cannot be employed as scan paths become candidates for selection.

The preservation of data of appropriated paths by the computer in this invention may include, for example: storage of various data in advance by the computer to a connected information storage medium, storage of various data by the computer to internal memory that is a part of the computer, and, if the information storage medium is, for example, a FD or a MO (magnetic optical disk), storage of various data by the computer to these mediums.

In a circuit of this invention, a multiplicity of circuit elements such as registers and multiplexers are interwired, and scan paths, which are signal paths for scan tests, are formed within the circuit. Moreover, the scan paths are formed in a configuration having the smallest occupied area because each portion of a scan path is constituted by the configuration of the two available configurations that has the smallest occupied area.

The above and other objects, features, and advantages of the present invention will become apparent from the following description with references to the accompanying drawings, which illustrate examples of the present invention.

DETAILED DESCRIPTION OF THE PREFERRED EMBODIMENTS

The first embodiment of the present invention is next described with reference to FIGS. 9 to 13.

Integrated circuit device 40 of this embodiment is realized by the functions of one portion of data processing system 41.

Figure 11:
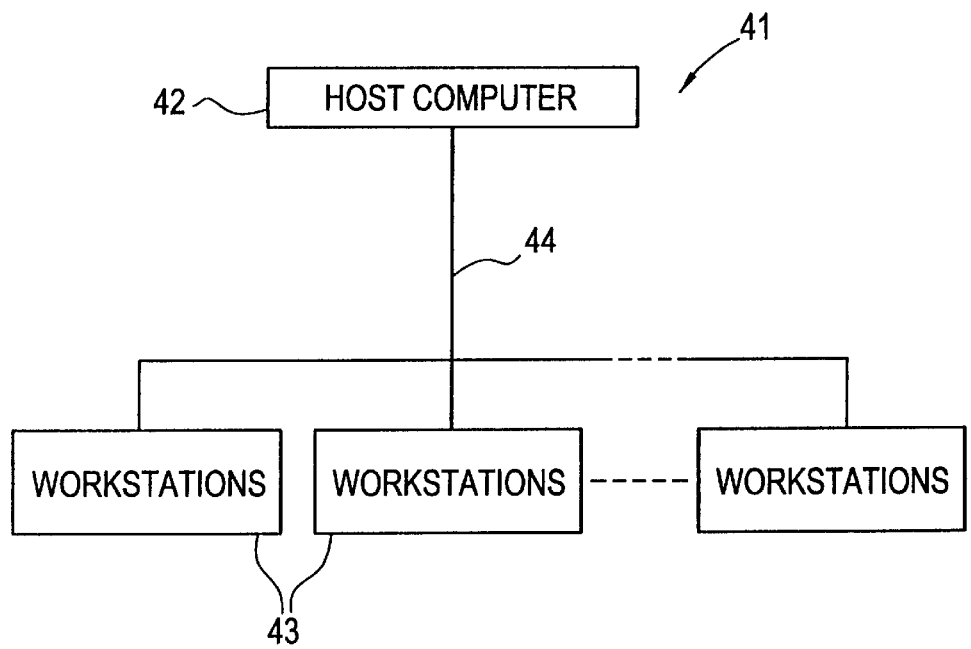
FIG. 11 is a block diagram showing the physical structure of a data processing system that functions as a circuit design device.

As shown in FIG. 11, this data processing system 41 is constituted by a client-server system in which a plurality of workstations 43 are connected to one host computer 42 by communication network 44.

Figure 12:
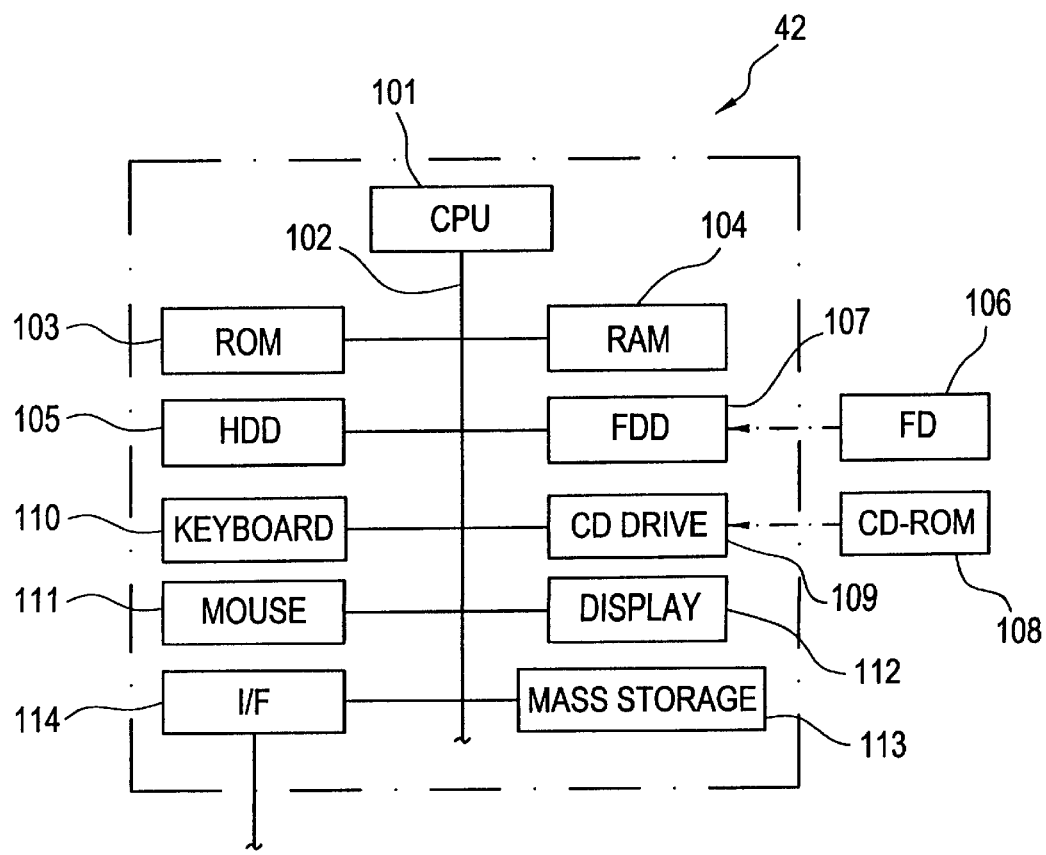
FIG. 12 is a block diagram showing the physical structure of a host computer.

As shown in FIG. 12, host computer 42 includes CPU 101 as the chief component of the computer. This CPU 101 is connected by bus line 102 to ROM 103, RAM 104, HDD 105, FDD 107 in which FD 106 is mounted, CD drive 109 in which CD-ROM 108 is mounted, keyboard 110, mouse 111, display 112, mass storage device 113, and communication I/F 114.

This communication I/F 114 is connected to communication network 44. This communication network 44 is connected to a plurality of workstations 43.

Mass storage device 113 is made up of a MO drive in which are parallel mounted a large number of MO and readably stores a large volume of information.

The physical configuration of workstations 43 does not include mass storage device 113 but is otherwise equivalent to that of host computer 42. The following explanation therefore uses identical names and reference numerals, and redundant explanation is omitted.

In data processing system 41 of this embodiment, the information storage mediums are constituted by ROM 103, RAM 104, HDD 105, FD 106, CD-ROM 108 mass storage device 113; and the program and data necessary for the processing operations of CPU 101 are stored as software on these components.

For example, a control program for causing CPU 101 to perform various types of processing operations is written beforehand to at least one of FD 106 and CD-ROM 108. This type of software is installed in advance to HDD 105, is copied to RAM 104 upon startup of host computer 42, and is read to CPU 101.

Figure 10:
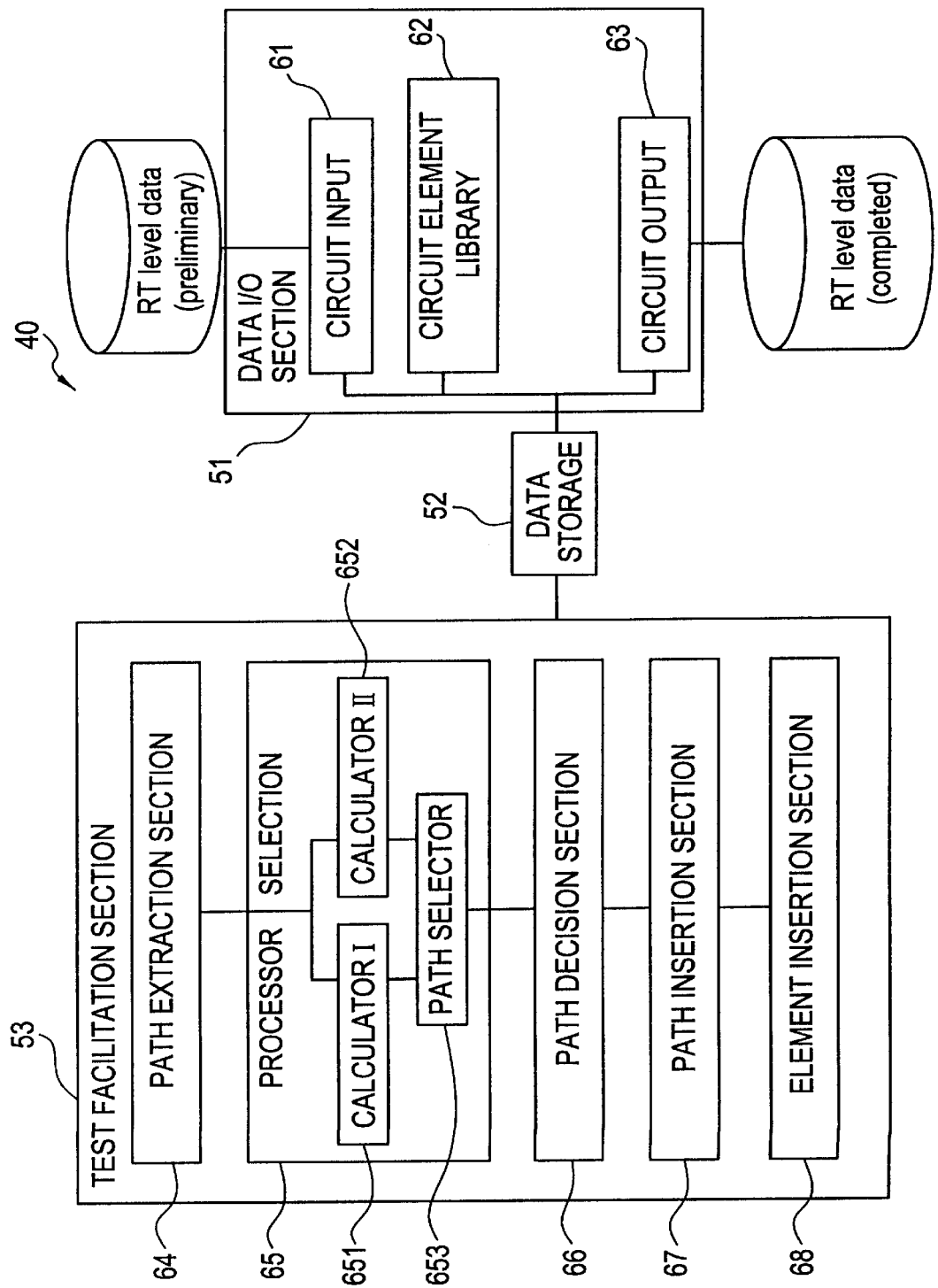
FIG. 10 is a schematic diagram showing the logical structure of a circuit design device according to the first embodiment of the present invention.

CPU 101 thus reads various programs and executes various processing operations, whereby data input/output section 51, data storage section 52, and test facilitation section 53 are logically formed as the main components of circuit design device 40 in data processing system 41 of this embodiment as shown in FIG. 10.

Data input/output section 51 includes circuit input section 61, circuit element library 62, and circuit output section 63. Test facilitation section 53 includes path extraction section 64, selection processor 65, path decision section 66, path insertion section 67, and element insertion section 68.

Circuit input section 61 of data input output section 51 corresponds to, for example, I/F 114 of workstation 43 through which various data are inputted from host computer 42 or FDD 107 of workstation 43 that reads out various data from FD 106, and accepts the data input of the design data of the preliminarily-designed register transfer level circuit.

Circuit element library 62 corresponds to, for example, mass storage device 113 of host computer 42 and can be read by workstation 43, and data regarding the occupied area of each type of circuit element, such as registers and multiplexers, are registered beforehand in this circuit element library 62.

Data storage section 52 corresponds to storage areas of RAM 104 of workstation 43 and this component temporarily stores in updateable form each stage of the design data of a circuit, such as preliminary design, intermediate design, and completed design.

CPU 101 performs arithmetic processing in accordance with design data of a circuit that are temporarily stored in RAM 104 of workstation 43 and software stored in advance in RAM 104, whereby path extraction section 64 of test facilitation section 53 individually extracts as appropriated paths the paths that can be appropriated as scan paths from among the multiplicity of paths that connect specific circuit elements of the circuit.

As in the second prior-art method described hereinabove, extraction of appropriated paths in a preliminary design of a circuit by the above-described path extraction section 64 takes as an object, a path that directly connects a register with a register, a path that directly connects a register with an external terminal, a path that connects a register with a register by way of only a multiplexer, and a path that connects a register with an external terminal by way of only a multiplexer.

Selection processor 65 includes first calculator 651, second calculator 652, and path selector 653, and is realized by the execution of arithmetic processing by CPU 101 in accordance with software stored beforehand in RAM 104 of workstation 43.

First calculator 651 reads as appropriate the occupied areas of the various circuit elements that have been registered beforehand in circuit element library 62 and calculates each of the occupied areas for cases of forming each of first-candidate scan paths by connecting control elements to the control terminals of multiplexers in appropriated paths that include a multiplexer.

Second calculator 652 also reads as appropriate the occupied areas of the various circuit elements that have been registered beforehand in circuit element library 62 and calculates each of the occupied areas for cases of forming each of second-candidate scan paths by replacing each register of a plurality of appropriated paths by a scan element.

When first calculator 651 calculates the occupied areas of a first candidate of scan paths by connecting control elements to the control terminals of multiplexers as described hereinabove, the occupied areas are calculated for a case in which various logic gates according to input conditions are connected as control elements, which are additional elements, to the control terminals of multiplexers, as in the above-described second method of the prior art.

Path selector 653 selects from the first candidate and second candidate of each of a plurality of appropriated paths the candidate for which the occupied area is smaller.

Path decision section 66, path insertion section 67, and element insertion section 68 form scan paths corresponding to the selection results of selection processor 65 through the execution of arithmetic processes by CPU 101 in accordance with software stored beforehand in RAM 104 of workstation 43.

To explain in detail, path decision section 66 determines as the scan path the candidate path that was selected based on the occupied area as described hereinabove.

Path insertion section 67 detects registers not connected to scan paths determined as described hereinabove, and connects these registers to scan paths by replacing them with scan flip-flops, which are scan elements.

Element insertion section 68 connects a variety of logic gates as control elements, which are additional elements, to the control terminals of multiplexers, which are required elements, that are inserted in the sections preceding registers, which are also required elements.

Circuit output section 63 corresponds to, for example, I/F 114 of workstation 43 that outputs various data to host computer 42 and FDD 107 of workstation 43 that stores various data to FD 106, and outputs the design data of a circuit for which scan path formation has been completed as described hereinabove.

Each of the above-described components is realized by using hardware such as FDD 104 and I/F 114 as necessary, but the main components are realized through the operation of CPU 101 of workstation 43 in accordance with software written to RAM 104.

This type of software is, for example, stored on an information storage medium such as RAM 104 as a control program for causing CPU 101 of workstation 43 to execute such processing operations as: accepting input of design data of a preliminarily-designed register transfer level circuit at input devices such as communication I/F 114 and FDD 107; temporarily storing in updateable form to an information storage medium such as RAM 104 the design data at each stage of circuit; individually extracting through the data processing of CPU 101 in accordance with prescribed algorithms a plurality of appropriated paths from the multiplicity of paths that connect specific circuit elements of the circuit; both individually calculating an occupied area or a case in which a first candidate for the scan path is formed by connecting control elements to the control terminals of multiplexers in each of appropriated paths that contain multiplexers, and individually calculating an occupied area for cases in which a second candidate for the scan path is formed by replacing the registers of each of a plurality of appropriated paths with scan elements; individually selecting from first candidate and second candidate for each of a plurality of appropriated paths those candidates having the smaller occupied area; forming scan paths that correspond to these selection results; and outputting the design data of a circuit for which scan path formation has been completed by output devices such as communication I/F 114 and FDD 107.

As software that is used in combination with the above-described control program, the occupied areas of each of various circuit elements such as registers and multiplexers are registered beforehand in mass storage device 113 as a data file of host computer 42 that can be read by workstation 43.

Figure 9:
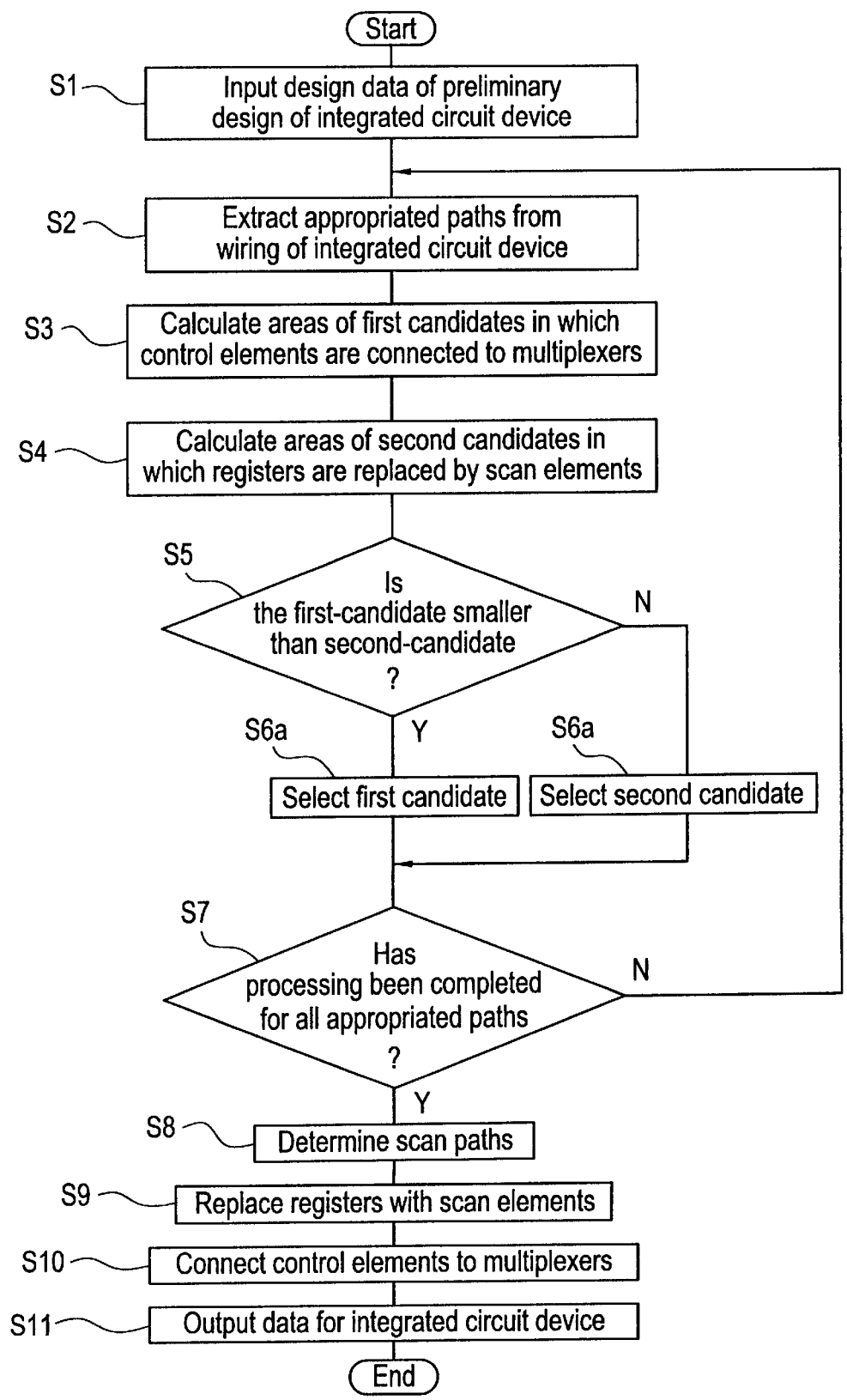
FIG. 9 is a flow chart showing the procedures of a design for testability method according to the first embodiment of the present invention.

Explanation will be next presented with reference to FIG. 9 regarding the design for testability method by circuit design device 40 of this embodiment in a construction as described above. Workstation 43 first inputs data from host computer 42, whereby the input of design data of a preliminarily-designed register transfer level circuit is accepted by circuit input section 61 as shown in Step S1.

Figure 1:
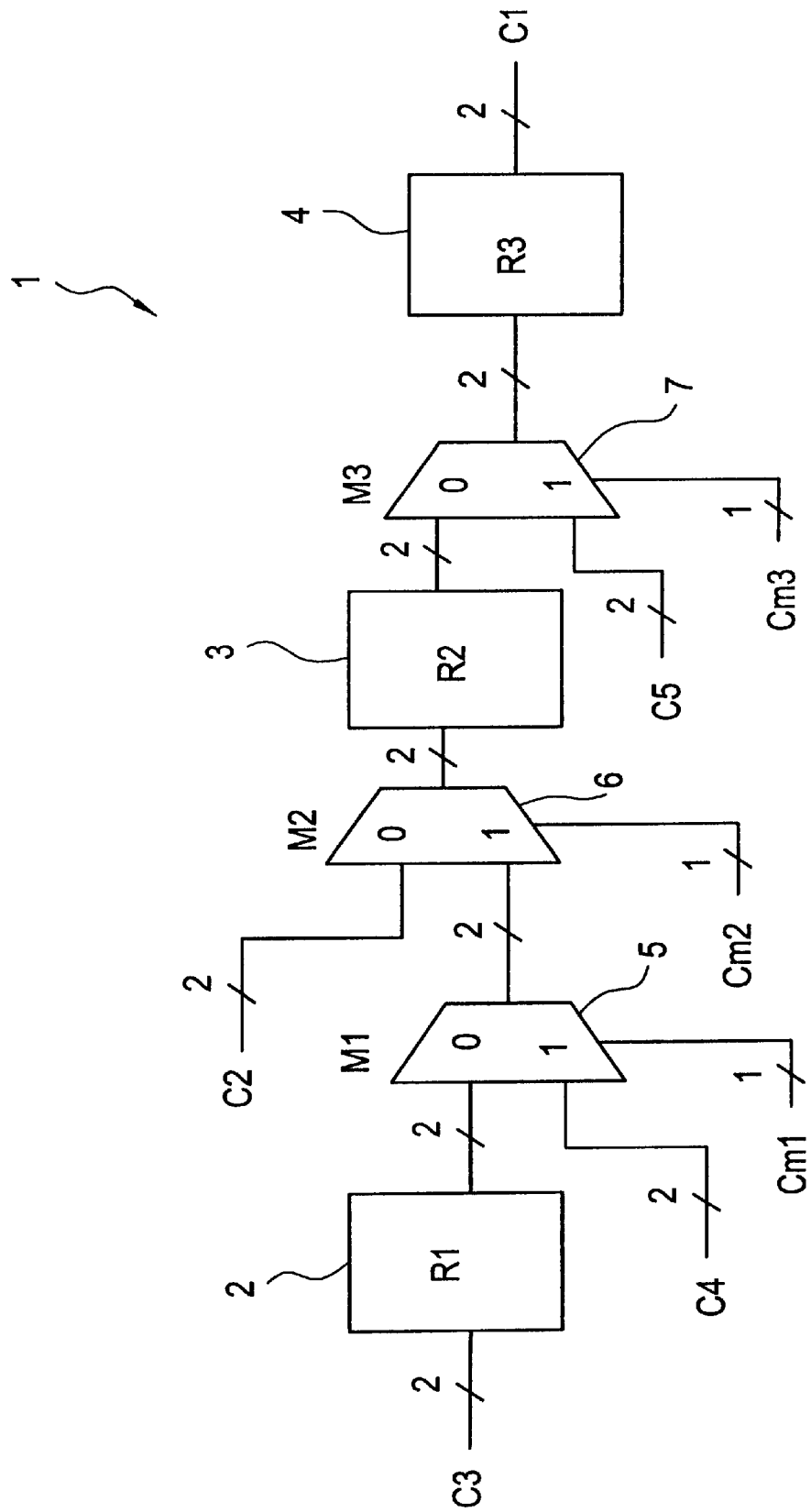
FIG. 1 is a block diagram showing the principal components of a circuit that has undergone preliminary design by the first example of the prior art.
Figure 2A:
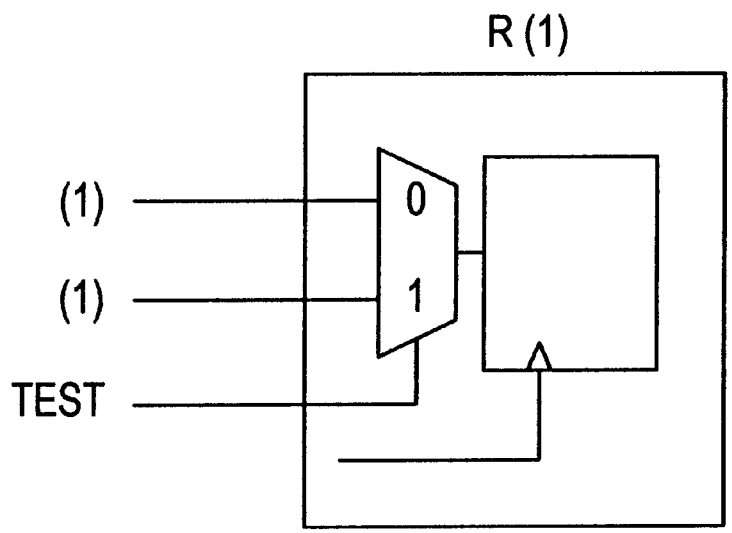
FIGS. 2a and 2b are circuit diagrams showing the internal configuration of a scan flip-flop, which is a scan element.
Figure 2B:
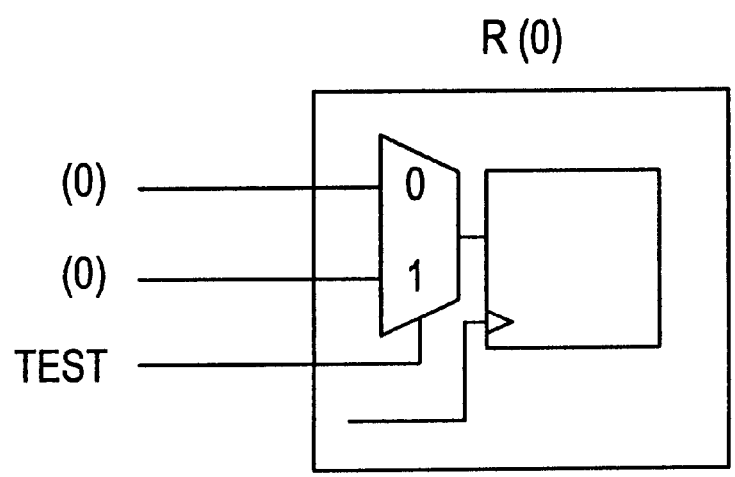
Figure 3:
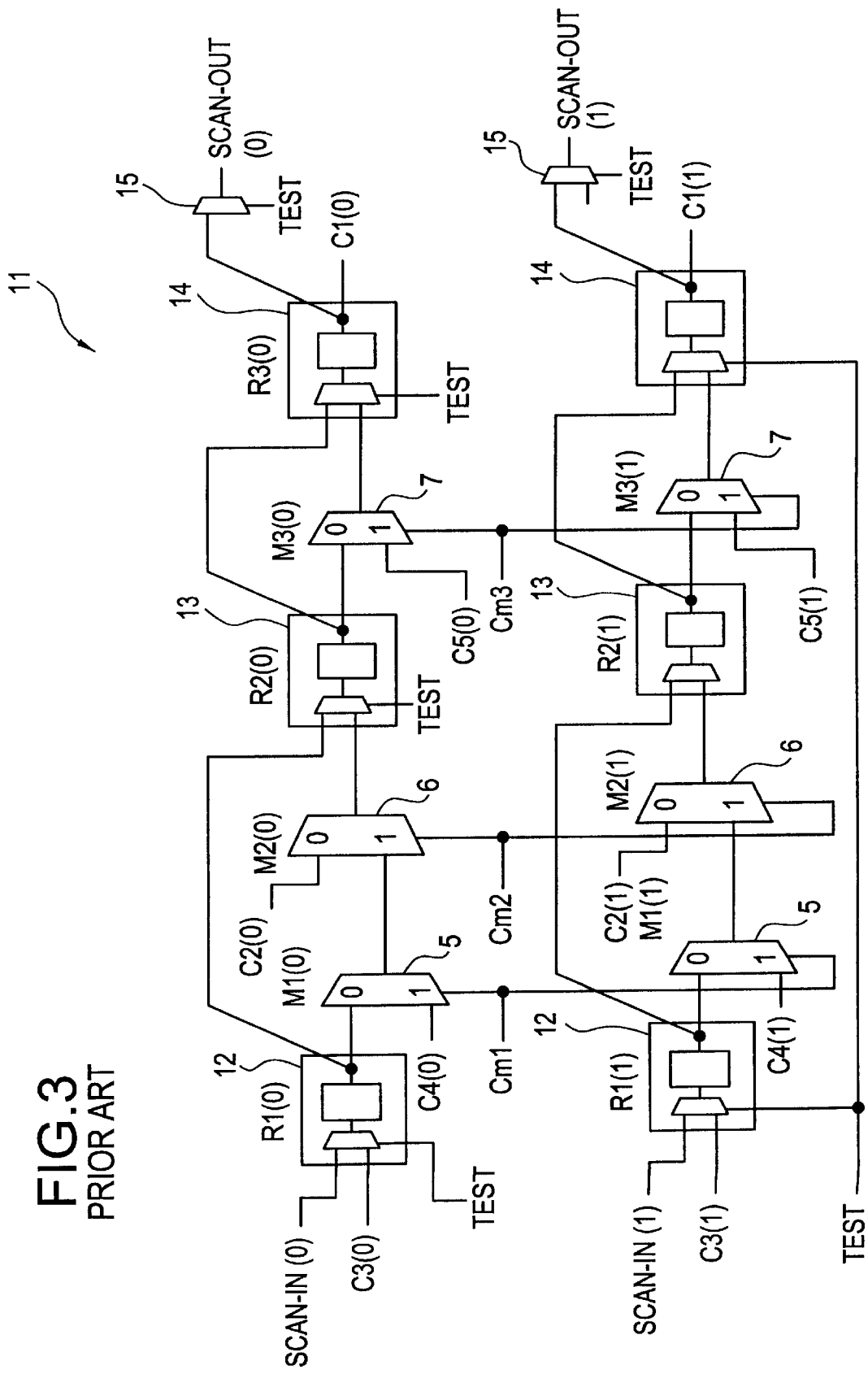
FIG. 3 is a block diagram showing the principal components of a circuit of the first example of the prior art.
Figures 4, 5:
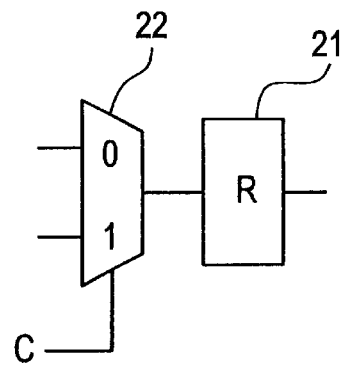
FIG. 4 is a block diagram showing the connection of a multiplexer, which is a required element, in a section preceding a register, which is a required element, in the second example of the prior art.
FIG. 5 is a block diagram showing the connection of various types of logic gates, which are control elements, as additional elements to a multiplexer.
Figure 6A:
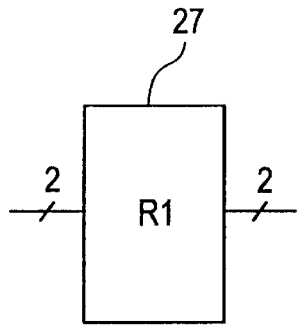
FIGS. 6a and 6b are block diagrams showing a case in which a register is not connected to a scan path.
Figure 6B:
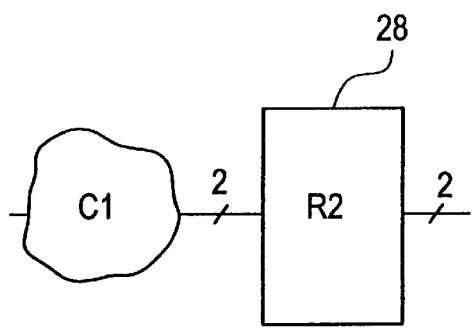
Figure 7A:
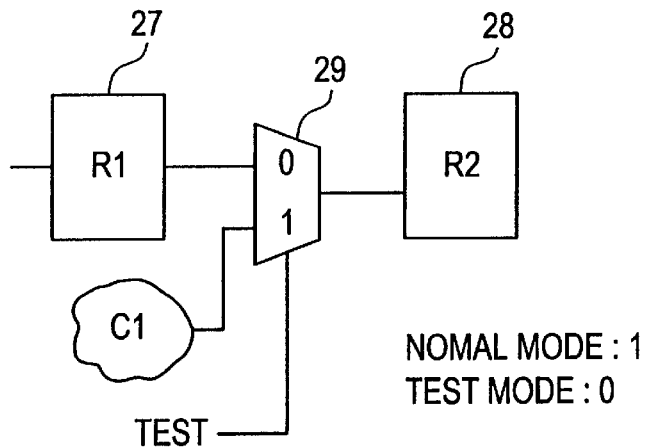
FIGS. 7a and 7b are block diagrams showing a case in which an isolated register is connected to a scan element by means of a multiplexer.
Figure 7B:
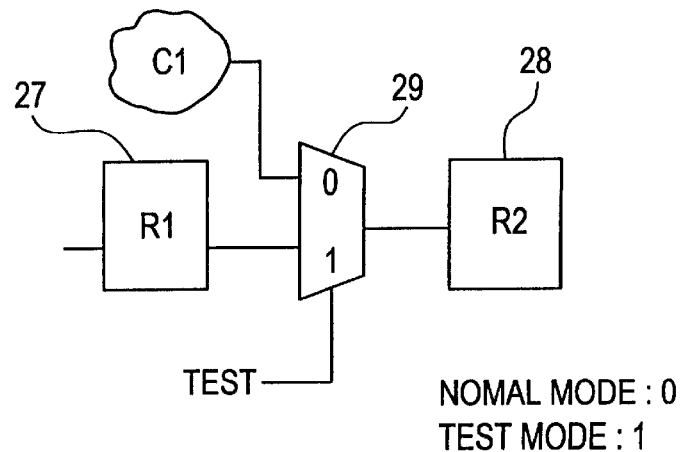
Figure 8:
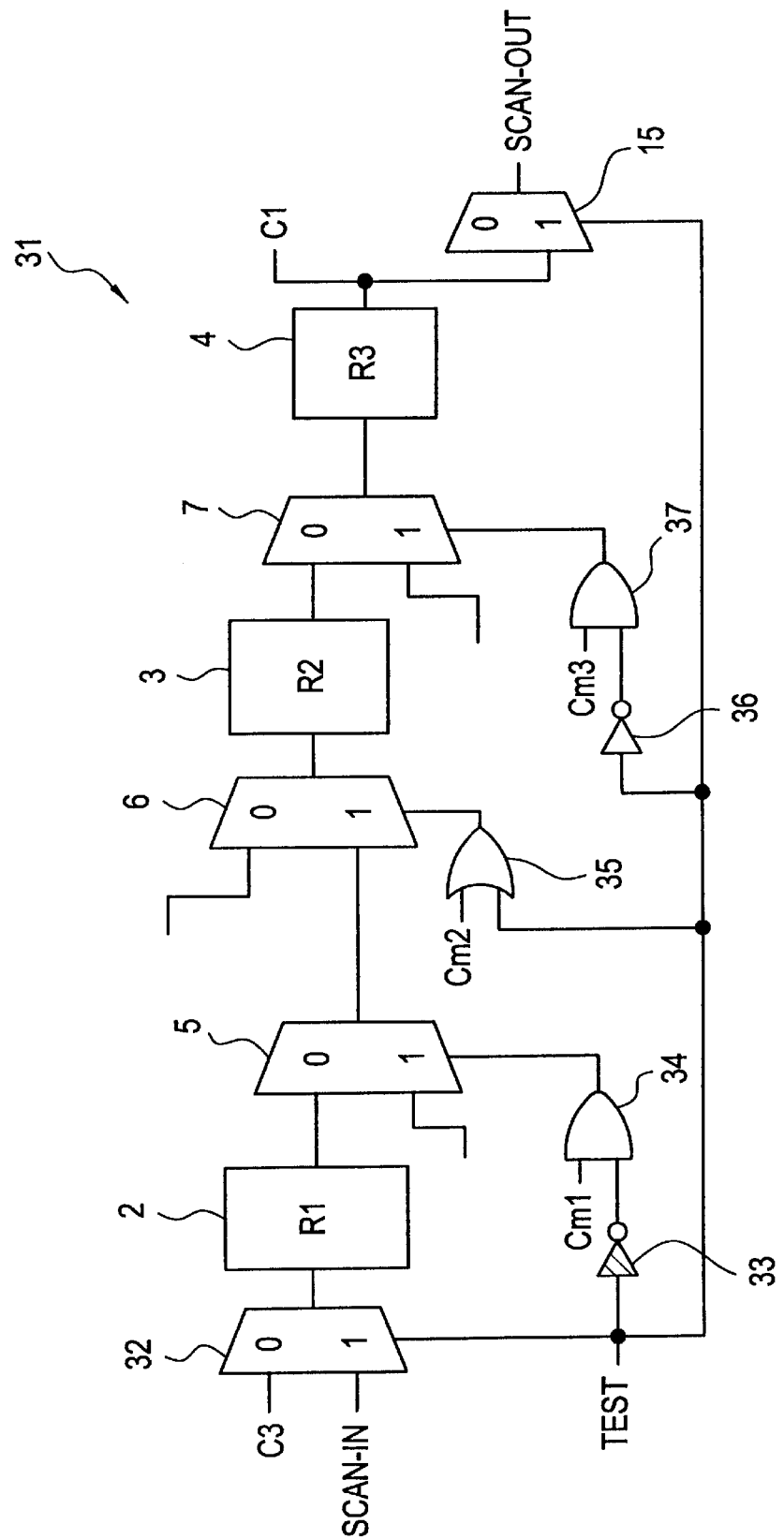
FIG. 8 is a block diagram showing the principal components of a circuit of the second example of the prior art.

The design data of register transfer level that has been preliminarily-designed in this way has been created as a configuration for interconnecting required elements as circuit elements without consideration for scan paths, for example, as in circuit 1 shown in FIG. 1.

In the interest of simplifying the explanation in this embodiment, a case in which the design data of circuit 1 of FIG. 1 is processed is herein described.

As described hereinabove, when the design data of circuit 1 are inputted, a multiplicity of appropriated paths are individually extracted from each portion of the path, as shown in Step S2. In more concrete terms, the design for testability method of circuit design device 40 according to this embodiment takes the registers of the data output section of the circuit as the starting points of path extraction and executes a sequential path search in the direction of fan-in by a depth-prioritizing search algorithm.

In this search process, processing is continued when a multiplexer is detected, is completed upon detection of another register or external terminal, and is halted upon detection of other circuit elements.

When all appropriated paths have been extracted with one register as the starting point as described above, another register is made the starting point and appropriated paths are extracted in the same way, the extraction of appropriated paths being carried out for all registers.

As an example, in the case of the above-described circuit 1 of FIG. 1, path extraction that takes second register 3 as the starting point first detects second multiplexer 6.

At this point, a search of input C2 that is activated when control signal Cm2 of multiplexer 6 has a logical value of "0" does not detect a multiplexer, an external terminal, or a register, and the search process is therefore halted.

A search of the input that is activated when control signal Cm2 of multiplexer 6 has a logical value of "1" detects first multiplexer 5, and the search process is therefore continued.

In this case, the search process is also carried out at first multiplexer 5 in the same way as in the above-described case. First register 2 is detected from the input when control signal Cm1 has a logical value of "0."

The search process of one appropriated path is completed when register 2 is thus detected, and the appropriated path that links "register 2→multiplexers 5 and 6→register 3" is extracted.

In the same way, taking third register 4 as the starting point results in the extraction of the appropriated path linking "register 3→multiplexer 7→register 4."

The multiplicity of appropriated paths that are sequentially extracted in this way are stored in RAM 104. When all appropriated paths have been extracted and stored, the appropriated paths are appropriately selected and scan paths are sequentially formed.

In greater detail, in the various appropriated paths that contain multiplexers, the occupied areas are calculated for cases in which a first candidate for the scan path is formed by connecting control elements to the control terminals of multiplexers, as shown in Step S3, and occupied areas are individually calculated for cases in which a second candidate for the scan path is formed by replacing each of the registers of a plurality of appropriated paths with scan elements, as shown in Step S4.

At this time, circuit elements used in the formation of first candidate and second candidate are detected for each of the appropriated paths, and the recorded data of the occupied areas of these elements are read from circuit element library 62 and added.

In this case, the occupied areas are simply read out for additional elements such as control elements that are connected to the control terminals of multiplexers. Area overhead, which is the amount of increase in occupied area, is read out for scan flip-flops, which are the scan elements that replace registers.

When the occupied areas of the appropriated paths have been individually calculated for the first candidate and second candidate as described above, these values are compared with each other and the candidates having the smaller occupied area are selected as shown in Steps S5 and S6.

Then, when the above-described process has been carried out for all appropriated paths as shown in Step S7, scan paths are determined such that the selected appropriated paths are used to the utmost as shown in Step S8.

When scan paths have been determined as described above, the scan paths are formed by replacing the registers by scan flip-flops, which are scan elements, as shown in Step S9, and by connecting logic gates, which are control elements, to multiplexers as shown in Step S10.

The design data of the circuit are completed at this point, and the completed design data of the circuit are consequently outputted by means of, for example, I/F 114 as shown in Step S11.

If scan paths are formed by the first candidate in the case of, for example, the above-described appropriated path linking "register 2→multiplexers 5 and 6→register 3," control elements must be connected to the control terminals of each of two multiplexers 5 and 6.

At first multiplexer 5, control signal Cm1 must be forcibly made a logical value "0" in test mode to activate the path connecting to register 2 of the preceding section as a scan path.

In this case, if control signal Cm1 of multiplexer 5 is made "1" in normal mode and "0" in test mode, the control element connected to this control terminal is:

Cm1 * TEST (where * is AND (logical product))

This is equivalent to one AND gate of two inputs, and the area overhead of circuit area resulting from the insertion of this control element can therefore be calculated as "2."

At second multiplexer 6, control signal Cm2 must be forcibly made a logical value of "1" in test mode to activate the path connecting to first multiplexer 5 as a scan path.

In this case, if control signal Cm2 of multiplexer 6 is made "0" in normal mode and "1" in test mode, the control element connected to this control terminal is:

Cm2 +/ TEST where "+" denotes OR (logical sum) and "/" denote NOT (logical negation).

This is equivalent to one two-input OR gate and one inverter, and the area overhead of circuit area resulting from the insertion of these control elements can therefore be calculated as: "2+1=3"

If a scan path is formed by the first candidate in an appropriated path linking "register 2→multiplexers 5 and 6→register 3," the area overhead in circuit area can be calculated as the total: "2+3=5"

In contrast, forming a scan path by the second candidate in the above-described appropriated path means replacing register 3 with a scan flip-flop.

This register 3 is formed from a two-bit configuration, and the total area overhead resulting from replacement can therefore be calculated as: "2×2=4"

In other words, in the portion of the appropriated path that links "register 2→multiplexers 5 and 6→register 3," forming the scan path using the second candidate results in less circuit area overhead than when using the first candidate. The scan path is formed with this determination as the selection result.

In the case of the appropriated path linking "register 3→multiplexer 7→register 4," forming the scan path using the first candidate necessitates connecting one AND gate as a control element to multiplexer 7. The area overhead in circuit area resulting from this insertion can be calculated as "2."

In contrast, forming the scan path using the second candidate involves replacing the two registers 2 and 4 with scan flip-flops, whereby the area overhead can be calculated as "4."

The scan path is therefore formed using the first candidate in the appropriated path linking "register 3→multiplexer 7→register 4."

Figure 13:
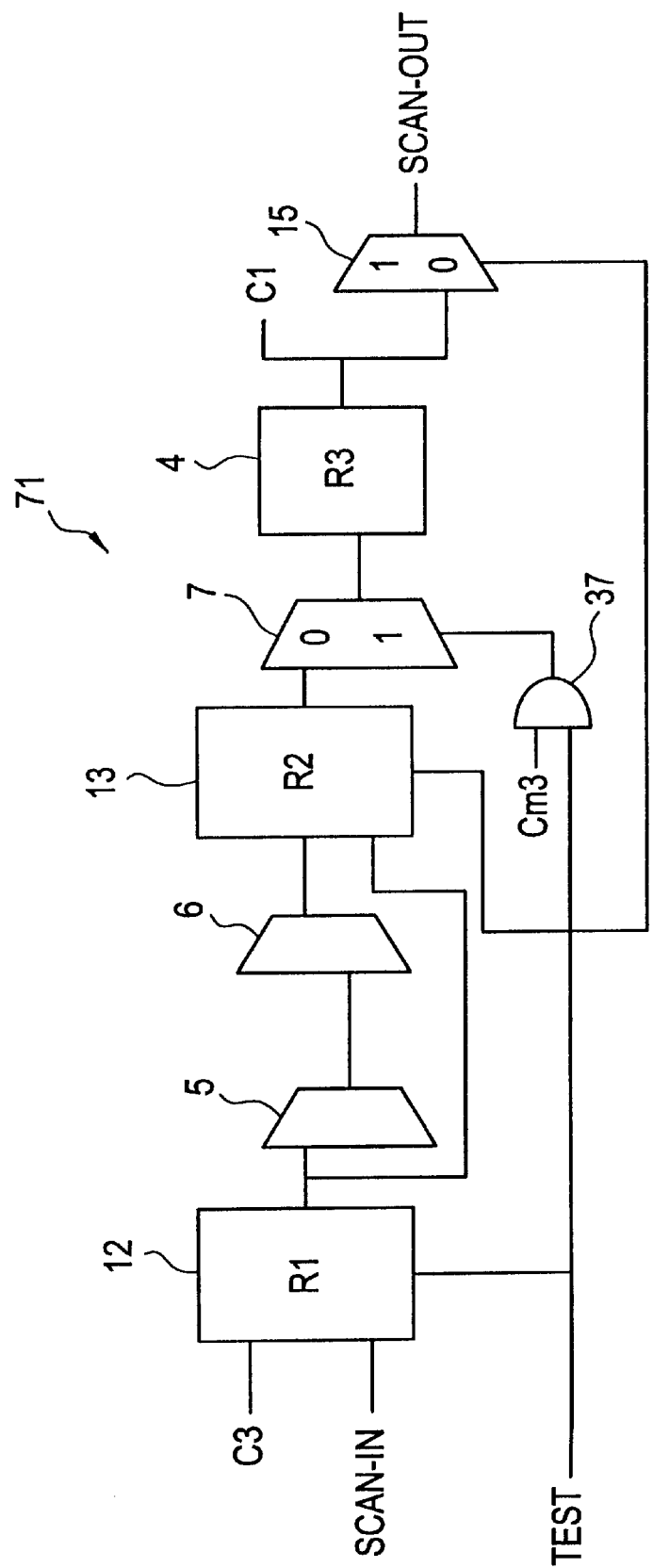
FIG. 13 is a block diagram showing the principal components of a circuit according to the first embodiment of the present invention.

In circuit 71 in which scan paths have been formed as described hereinabove, register 2 is replaced by scan flip-flop 12 to form a path that continues from scan-in, as shown in FIG. 13. In the path that links "register 2→multiplexers 5 and 6→register 3," a scan path is formed by replacing register 3 with scan flip-flop 13.

The path linking "register 3→multiplexer 7→register 4," finally, takes on a configuration in which one AND gate 37 is added as a control element to the control terminal of multiplexer 7, and multiplexer 15 is added for scan-out.

The area overhead of occupied area of circuit 71 in which scan paths have been formed in this way with respect to circuit 1 of preliminary design is: "8+2+(4×2)=18"

This figure is smaller than the value "20" for the area overhead of circuit 11 of the first prior-art example, and is also smaller than the value "24" for the area overhead of circuit 31 of the second prior-art example.

If scan paths are designed on circuit 71 based on the design for testability method of circuit design device 40 of the present embodiment, scan paths are individually formed by the most appropriate of two methods in the positions of appropriated paths of each portion of the preliminary-designed circuit.

A circuit can therefore be designed with the smallest possible area, thereby allowing a contribution to the miniaturization and lightening as well as increased productivity of circuits.

In addition, designing scan paths in a circuit based on the design for testability method of circuit design device 40 of this embodiment connects an isolated register to a scan path not by inserting a multiplexer into the section preceding this register but rather, by replacing the register with a scan flip-flop, thereby allowing a further reduction in the area of the circuit.

In the above-described modification, circuit design device 40 takes registers located in the data input section as starting points and executes a path search in the fan-in direction by means of a depth-prioritizing search algorithm when extracting appropriated paths from the design data of the preliminary design of a circuit.

However, various already existing methods can be employed as the algorithm of this path extraction, and the search starting points and direction may be variously set.

In addition, in the above-described modification, a case was described in which circuit design device 40 takes registers as starting points and simply selects appropriated paths from various types of path when extracting appropriated paths from the design data of a preliminary design of a circuit and forming scan paths.

Figure 14:
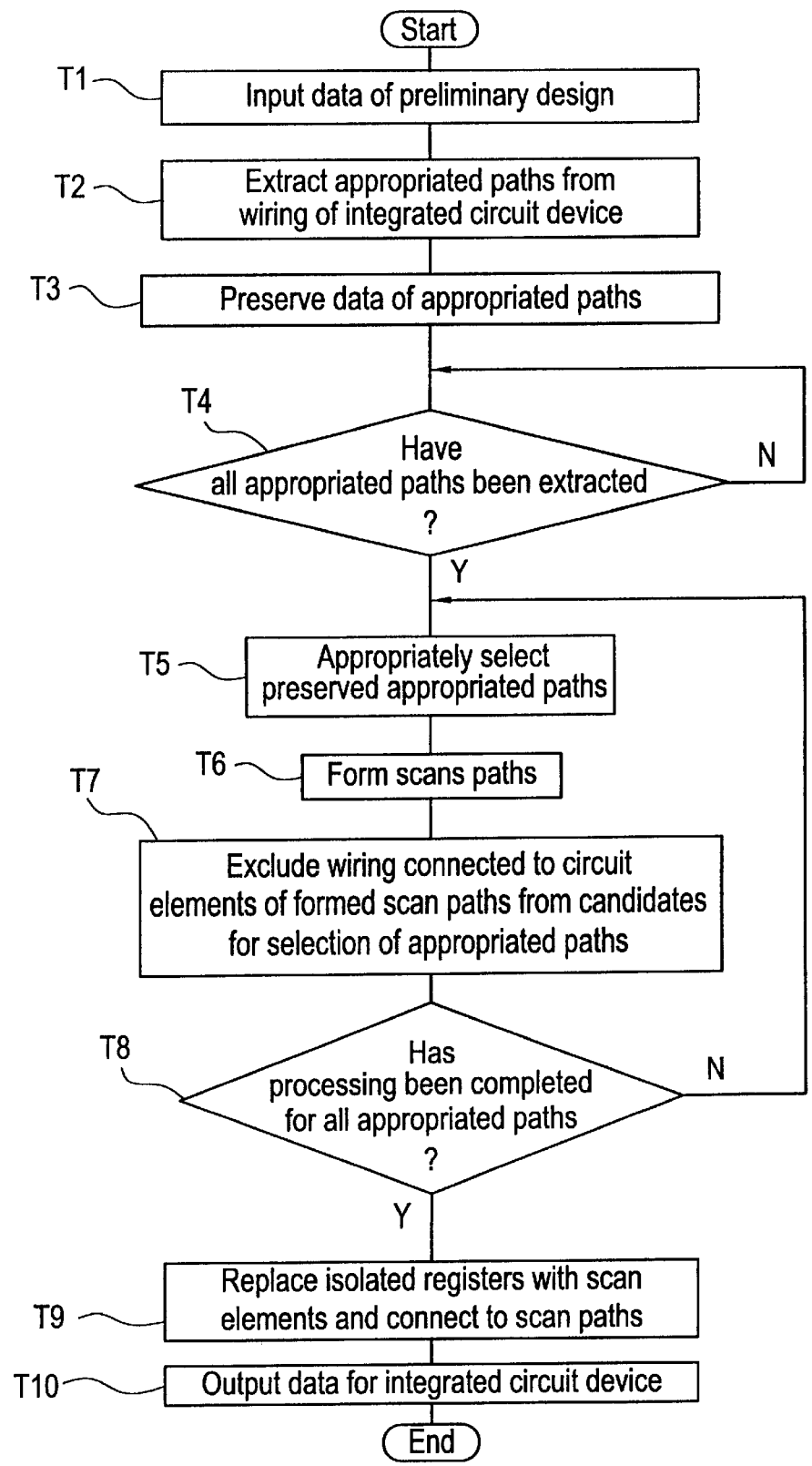
FIG. 14 is a flow chart showing the procedures of one modification of the design for testability method of the present invention.

However, when appropriately selecting a multiplicity of appropriated paths that have been extracted and preserved and forming scan paths as shown in Steps T5–T8 of FIG. 14, paths connected to the circuit elements of appropriated paths that have been selected as scan paths is excluded from the candidates for subsequent selection of appropriated paths as shown in Step T7, thereby allowing an improvement in the efficiency of forming scan paths.

When realizing a circuit design device for effecting this design for testability method, a path storage section and candidate selection section may be realized by the execution of processing by a CPU, i.e., a computer, in accordance with a program stored in an information storage medium such as RAM, and this candidate selection section may exclude a path that is connected to the circuit elements of extracted appropriated paths from the candidates for subsequent selection of appropriated paths.

When the design data of a preliminarily-designed register transfer level circuit are supplied to the data input section, paths that can be appropriated as scan paths are sequentially extracted by the path extraction section as appropriated paths from the multiplicity of paths that connect specific circuit elements of this inputted circuit.

This multiplicity of appropriated paths that are sequentially extracted are stored, and scan paths are sequentially formed by appropriately selecting the stored multiplicity of appropriated paths.

When appropriated paths are appropriately selected to sequentially form scan paths in this way, paths that are connected to circuit elements of appropriated paths that have been selected as scan paths are excluded from candidates in subsequent selection of appropriated paths.

Superfluous processing, in which appropriated paths that cannot be used as scan paths become candidates for selection, is thus prevented.

Although a case was described hereinabove in which a client-server system served as circuit design device 40 that carries out the design for testability method, this type of circuit design device 40 may also be realized by one stand-alone computer unit.

In addition, a case was described in which data base 13 produced by host computer 42 is used on-line by workstation 43. However, it is also possible to supply data base 13 produced by host computer 42 as described above to workstation 43 off-line by, for example, FD 106.

Further, in the above-described modification, each portion of data processing system 41 was realized through the operation of CPU 101 in accordance with software stored in information storage medium such as RAM 104 in host computer 42 and workstation 43.

However, it is also possible to form each of these portions as fixed hardware, and it is also possible to store a portion as software on an information storage medium and to form a portion as hardware.

In the above-described modification, it was assumed that software stored beforehand on HDD 105 is copied to RAM 104 upon startup of host computer 42 and workstation 43, and that CPU 101 reads software thus stored in RAM 104.

However, it is also possible for CPU 101 to use such software that has been stored in HDD 105 or to permanently write such software to ROM 103 beforehand.

Further, examples have been described in which software was written to an information storage medium that can be handled as a unit, such as FD 106 or CD-ROM 108, and then installed to fixed devices such as RAM 104 or HDD 105 from FD 106 or CD-ROM 108.

However, it is also possible for CPU 101 to read software directly from, for example, FD 106, and perform processing without installing in this way.

Essentially, a case in which each portion of the data processing system of this invention is realized by software admits any configuration in which CPU 101 can read this software and carry out corresponding operations.

In addition, the control program that realizes each of the above-described components can be formed by a combination of a plurality of software components. In such a case, only the minimum necessary software for realizing the data processing system of the present invention need be stored on the information storage medium that serves as a unit product.

For example, in a case in which the application software is provided by means of an information storage medium such as CD-ROM 108 to host computer 42 in which an already existing operating system has been installed, the software for realizing each component of the data processing system of the present invention is actually realized by a combination of the application software and the operating system, and those portions of the software that are effected by the operating system therefore can be omitted from the application software on the information storage medium.

While preferred embodiments of the present invention have been described using specific terms, such description is for illustrative purposes only, and it is to be understood that changes and variations may be made without departing from the spirit or scope of the following claims.

What is claimed is:

1. A design for testability method comprising:

extracting paths that can be appropriated as scan paths from a multiplicity of paths that connect specific circuit elements in a preliminarily-designed register transfer level circuit;

for each of said extracted paths that include at least one multiplexer as one of said circuit elements, forming a first candidate scan path by connecting control elements to each said multiplexer and calculating an area occupied by said first candidate scan path;

for each of said extracted paths that include registers as said circuit elements, forming a second candidate scan path by replacing each of said registers with a scan element and calculating an area occupied by said second candidate scan path;

for each of said extracted paths, selecting from said first candidate scan path and said second candidate scan path the candidate scan path having the smaller occupied area; and for each of said extracted paths, forming a scan path based on the selected result.

2. A design for testability method comprising:

extracting paths that can be appropriated as scan paths from a multiplicity of paths that connect specific circuit elements in a preliminarily-designed register transfer level circuit;

for each of said extracted paths that include at least one multiplexer as one of said circuit elements, forming a first candidate scan path by connecting controls elements to each said multiplexer and calculating an area occupied by said first candidate scan path;

for each of said extracted paths that include registers as said circuit elements, forming a second candidate scan path by replacing each of said registers with a scan element and calculating an area occupied by said second candidate scan path wherein said scan element is optimized such that said scan element occupies an area less than an area occupied by inserting a multiplexer in a section preceding a register;

for each of said extracted paths, selecting from said first candidate scan path and said second candidate scan path the candidate scan path having the smaller occupied area;

for each of said extracted paths, forming a scan path based on the selected result; and replacing registers that are not connected to said formed scan paths with other scan elements and connecting said other scan elements to said scan paths.

3. A design for testability method comprising:

extracting paths, in order, that can be appropriated as scan paths from a multiplicity of paths that connect specific circuit elements in a preliminarily-designed register transfer level circuit;

storing said extracted paths;

sequentially forming scan paths in a circuit by appropriately selecting said extracted paths from the multiplicity of said stored paths; and excluding as candidates for subsequent selection, said extracted paths that connect to at least one circuit element that is included in said extracted paths that have been selected and formed as said scan paths in the preceding step.

4. A circuit design device comprising:

data storage means for storing in advance, data regarding the occupied area of each type of circuit element;

data input means for inputting design data of a preliminarily-designed register transfer level circuit;

path extraction means for extracting paths that can be appropriated as scan paths from a multiplicity of paths that connect specific circuit elements of said circuit whose design data have been inputted to said data input means;

first calculation means for said paths extracted by said path extraction means that include at least one multiplexer as said circuit elements for calculating an area occupied by a first candidate scan path which is formed by connecting control elements to said multiplexer;

second calculation means for said paths extracted by said path extraction means that include registers as said circuit element for calculating an area occupied by a second candidate scan path which is formed by replacing each of said registers with a scan element;

path selection means for each of said extracted paths for selecting from said first candidate scan path and said second candidate scan path the scan path having the smaller occupied area; and path formation means for forming scan paths based on the selection results of said path selection means.

5. A circuit design device comprising:

data input means for inputting design data of a preliminarily-designed register transfer level circuit;

path extraction means for extracting paths in order that can be appropriated as scan paths from the multiplicity of paths that connect specific circuit elements of said circuit whose design data have been inputted to said data input means;

path storage means for storing said paths that have been extracted in order by said path extraction means;

path formation means for sequentially forming scan paths by appropriately selecting said extracted paths from the multiplicity of said paths that have been stored in said path storage means; and candidate selection means for excluding as candidates for subsequent selection, said extracted paths that connect to at least one circuit element that is included in said extracted paths that have been selected and formed as scan paths by said path forming means.

6. An information storage medium on which is stored a program for causing a computer to execute comprising:

a process for accepting input of design data of a preliminarily-designed register transfer level circuit;

a process for extracting paths that can be appropriated as scan paths from a multiplicity of paths that connect specific circuit elements of said circuit whose design data have been inputted;

a process for calculating, for each of said extracted paths that include at least one multiplexer, an area occupied by a first candidate scan path which is formed by connecting control elements to said multiplexer;

a process for calculating, for each of said extracted paths that include registers as circuit elements, an area occupied by a second candidate scan path which is formed by replacing each of said registers with a scan element;

a process for selecting, for each of said extracted paths, from said first candidate scan path and said second candidate scan path the scan path having the smaller occupied area; and a process for forming scan paths based on the selected result.

7. An information storage medium on which is stored a program for causing a computer to operate comprising:

a process for accepting input of design data of a preliminarily-designed register transfer level circuit;

a process for extracting paths, in order, that can be appropriated as scan paths from a multiplicity of paths that connect specific circuit elements of said circuit whose design data have been inputted;

a process for storing said extracted paths;

a process for sequentially forming scan paths by appropriately selecting said extracted paths from the multiplicity of said stored paths; and a process for excluding as candidates for subsequent selection, said extracted paths that connect to at least one circuit element that is included in said extracted paths that have been selected and formed as scan paths.

8. An integrated circuit device comprising a multiplicity of interwired circuit elements and formed scan paths;

wherein said circuit elements comprise required elements necessary for normal operation and additional elements added for scan testing;

wherein said required elements include registers and multiplexers;

wherein said additional elements include control elements;

wherein appropriated paths, in which control elements are connected to said multiplexers that are connected to said registers; and normal paths, in which said registers are replaced by scan elements that have said additional elements, are combined to form said scan paths; and of the appropriated path and normal path, each portion of a scan path is made up by the path having the smallest occupied area.

9. An integrated circuit device wherein a multiplicity of circuit elements are interwired and scan paths are formed;

and wherein said scan paths are formed based on the design for testability method of the invention of any of claims 1 to 3.

10. A circuit design device comprising:

a data storage section in which data regarding the occupied area of each type of circuit element is stored in advance;

a data input section which inputs design data of a preliminarily-designed register transfer level circuit;

a path extraction section that extracts paths that can be appropriated as scan paths from a multiplicity of paths that connect specific circuit elements of said circuit whose design data have been inputted to said data input section;

a first calculator for said paths extracted by said path extraction section that include at least one multiplexer as said circuit elements that calculates an area occupied by a first candidate scan path which is formed by connecting control elements to said multiplexer;

a second calculator for said paths extracted by said path extraction section that include registers as said circuit element that calculates an area occupied by a second candidate scan path which is formed by replacing each of said registers with a scan element;

a path selector for each of said extracted paths that selects from said first candidate scan path and said second candidate scan path the scan path having the smaller occupied area; and a path former that forms scan paths based on the selection results of said path selector.

11. A circuit design device comprising:

a data input section that inputs design data of a preliminarily-designed register transfer level circuit;

a path extraction section that extracts paths in order that can be appropriated as scan paths from the multiplicity of paths that connect specific circuit elements of said circuit whose design data have been inputted to said data input section;

a path storage section that stores said paths that have been extracted in order by said path extraction section;

a path formation section that sequentially forms scan paths by appropriately selecting said extracted paths from the multiplicity of said paths that have been stored in said path storage section; and a candidate selection section that excludes as candidates for subsequent selection, said extracted paths that connect to at least one circuit element that is included in said extracted paths that have been selected and formed as scan paths by said path formation section.

* * * * *